(12) United States Patent
Mathai et al.

(10) Patent No.: US 11,002,926 B1
(45) Date of Patent: May 11, 2021

(54) WAVELENGTH DIVISION MULTIPLEXING OPTICAL MODULE

(71) Applicant: Hewlett Packard Enterprise Development LP, Houston, TX (US)

(72) Inventors: Sagi Varghese Mathai, Sunnyvale, CA (US); Paul Kessler Rosenberg, Sunnyvale, CA (US); Wayne Victor Sorin, Mountain View, CA (US); Michael Renne Ty Tan, Menlo Park, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 16/677,357

(22) Filed: Nov. 7, 2019

(51) Int. Cl.
| | |
|---|---|
| *G02B 6/42* | (2006.01) |
| *H01S 5/022* | (2006.01) |
| *H04B 10/66* | (2013.01) |
| *H04B 10/25* | (2013.01) |
| *H01L 25/04* | (2014.01) |
| *H01S 5/42* | (2006.01) |

(Continued)

(52) U.S. Cl.
CPC ......... *G02B 6/4206* (2013.01); *G02B 6/4232* (2013.01); *G02B 6/4284* (2013.01); *G02B 6/4292* (2013.01); *H01L 25/042* (2013.01); *H01S 5/02272* (2013.01); *H01S 5/02276* (2013.01); *H01S 5/04257* (2019.08); *H01S 5/423* (2013.01); *H04B 10/25* (2013.01); *H04B 10/50* (2013.01); *H04B 10/66* (2013.01); *H04J 14/02* (2013.01)

(58) Field of Classification Search
CPC .. G02B 6/4206; G02B 6/4232; G02B 6/4292; G02B 6/4284; H01S 5/02272; H01S 5/423; H01S 5/02276; H01S 5/04257; H04B 10/66; H04B 10/25; H04B 10/50
See application file for complete search history.

(56) References Cited

U.S. PATENT DOCUMENTS

| | | |
|---|---|---|
| 5,796,714 A | 8/1998 | Chino et al. |
| 6,485,996 B2 | 11/2002 | Chirovsky et al. |

(Continued)

FOREIGN PATENT DOCUMENTS

| | | |
|---|---|---|
| EP | 2506370 A1 | 10/2012 |

OTHER PUBLICATIONS

Grabherr et al., "Comparison of approaches to 850 nm 2-D VCSEL arrays", vol. 4994, Proceedings of SPIE, 2003, pp. 83-91.

*Primary Examiner* — Ryan A Lepisto
(74) *Attorney, Agent, or Firm* — Hewlett Packard Enterprise Patent Department

(57) ABSTRACT

Examples herein relate to optical modules. In particular, implementations herein relate to optical modules that include top-emitting VCSELs and/or top-entry photodetectors. The optical modules include a first interposer having opposing first and second sides and a second interposer having opposing first and second sides. The optical modules include a plurality of top-emitting vertical-cavity surface-emitting lasers (VCSELs) coupled to the second interposer and a plurality of electrical conductors forming electrical paths between electrical contacts of the top-emitting VCSELs and the second side of the second interposer. The VCSELs are configured to emit optical signals having different wavelengths. The optical signals are configured to be combined and transmitted over a single optical fiber.

17 Claims, 9 Drawing Sheets

(51) Int. Cl.
  *H04B 10/50*   (2013.01)
  *H01S 5/042*   (2006.01)
  *H04J 14/02*   (2006.01)

(56) References Cited

U.S. PATENT DOCUMENTS

| | | |
|---|---|---|
| 7,038,288 B2 | 5/2006 | Lai et al. |
| 7,851,811 B2 * | 12/2010 | Dutta ................ G02B 6/43 257/84 |
| 8,290,008 B2 * | 10/2012 | Andry ................ G02B 6/428 372/36 |
| 8,488,921 B2 | 7/2013 | Doany et al. |
| 9,794,017 B2 | 10/2017 | O'Daniel |
| 9,798,087 B1 * | 10/2017 | Mathai ................ G02B 6/4269 |
| 10,120,149 B1 * | 11/2018 | Mathai ................ G02B 6/425 |
| 2003/0006416 A1 | 1/2003 | Dudoff et al. |
| 2005/0253264 A1 | 11/2005 | Aiba |
| 2006/0109883 A1 | 5/2006 | Lewis et al. |
| 2009/0323748 A1 | 12/2009 | Nobuhara |
| 2011/0044369 A1 | 2/2011 | Andry et al. |
| 2013/0134581 A1 | 5/2013 | Lin et al. |
| 2014/0037247 A1 | 2/2014 | Mathai et al. |
| 2014/0167254 A1 | 6/2014 | Lin et al. |

\* cited by examiner

WAVELENGTH DIVISION MULTIPLEXING OPTICAL MODULE

CROSS-REFERENCE TO RELATED APPLICATIONS

This application is related to commonly assigned U.S. application Ser. No. 16/397,083, filed on Apr. 29, 2019, the contents of which is hereby incorporated by reference in its entirety.

BACKGROUND

Optoelectronic communication (e.g., using optical signals to transmit electronic data) is becoming more prevalent as a potential solution, at least in part, to the ever increasing demand for high bandwidth, high quality, and low power consumption data transfer in applications such as high performance computing systems, large capacity data storage servers, and network devices. Wavelength division multiplexing (WDM) is useful for increasing communication bandwidth by combining and sending multiple data channels or wavelengths from multiple optical sources over an optical fiber.

BRIEF DESCRIPTION OF THE DRAWINGS

Certain examples are described in the following detailed description and in reference to the drawings, in which.

DETAILED DESCRIPTION OF SPECIFIC EXAMPLES

The present disclosure describes various examples of a WDM optical module that includes a plurality of laser sources to emit and/or a plurality of photodetectors to receive optical signals having different wavelengths. For example, the laser sources can be top-emitting vertical-cavity surface-emitting lasers (VCSELs) and the photodetectors can be top-entry photodetectors coupled to a second interposer. A multiplexer can be used to join the optical signals emitted by the VCSELs through a first interposer together before transmitting them over an optical fiber. The first interposer coupled to and disposed above the second interposer. A demultiplexer of an optical receiving module coupled to an opposing end of the optical fiber can subsequently be used to separate the optical signals transmitted by the optical fiber to be received by respective photodetectors, as described in more detail below.

The first interposer can be constructed of glass or other suitable materials with a relatively high-index of refraction (e.g., GaAs, GaP, GaN, InP). For example, the first interposer can be a glass die or wafer. The first interposer is disposed over or above the second interposer such that the top-emitting VCSELs or the top-entry photodetectors are disposed between the interposer and the substrate. As described herein, the "second interposer" can refer to an organic build-up substrate, a Si-interposer, an SOI interposer, integrated circuit (e.g., ASIC), chip, die, or printed circuit board depending on the application. Further, the optical module includes electrical conductors forming electrical paths between top-side electrical contacts of the top-emitting VCSELs (or the top-entry photodetectors) and the second interposer. The second interposer can further include electrically conductive traces or vias to pass electrical signals to or from the electrical conductors to an integrated circuit (e.g., an ASIC, driver integrated circuit, receiver integrated circuit) for driving the top-emitting VCSELs or processing electrical signals converted by the top-entry photodetectors.

An "optical fiber" as described herein can refer to a single optical fiber (e.g., including a core and a cladding) to provide unidirectional or bidirectional optical communication, can refer to a bidirectional pair of optical fibers (e.g., each including a core and a cladding) to provide both transmit and receive communications in an optical network, or can refer to a multi-core fiber, such that a single cladding could encapsulate a plurality of single-mode cores.

Figure 1A:
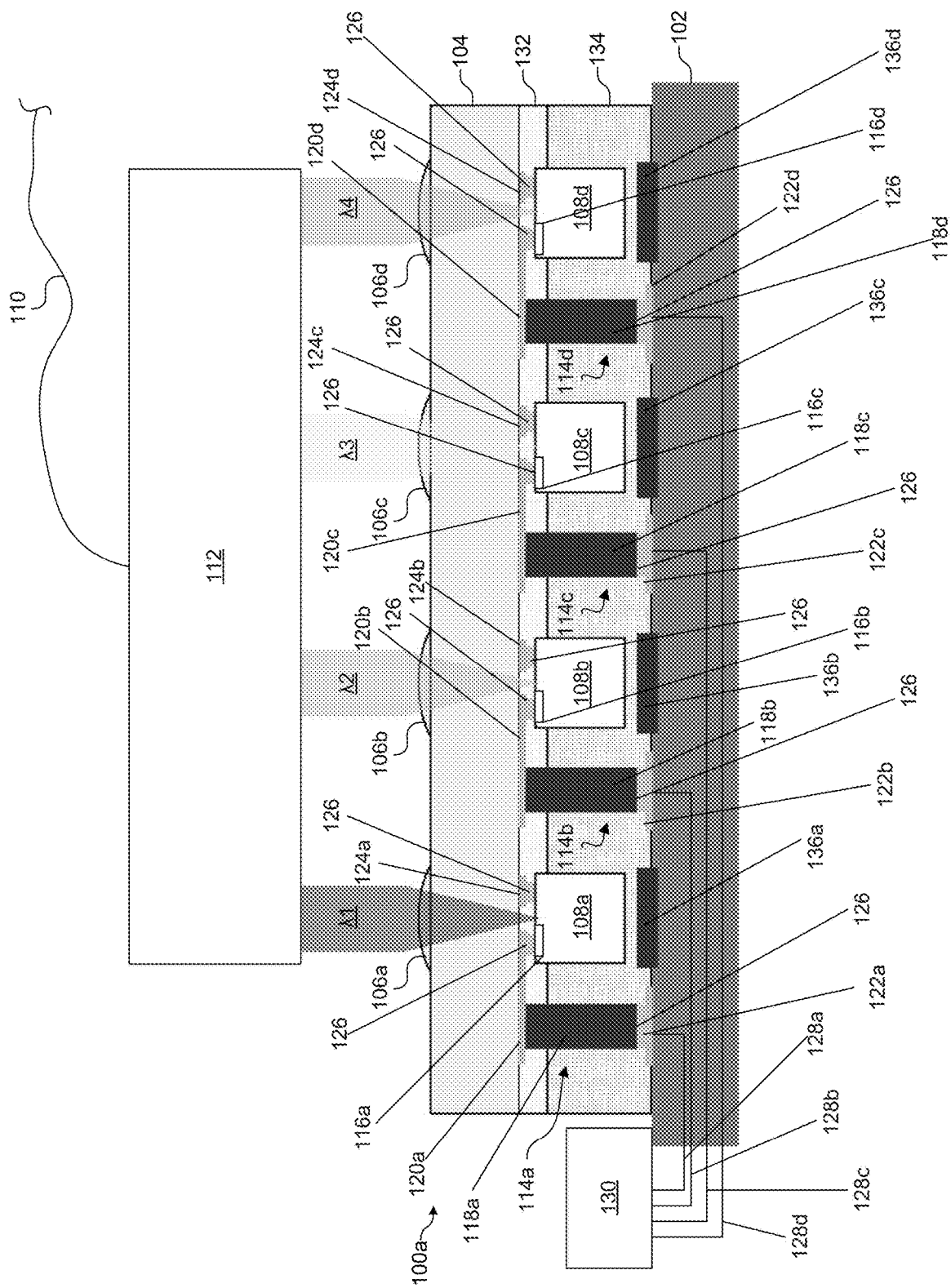
FIG. 1A schematically illustrates a section view of a block diagram of an example of an optical module according to the present disclosure.
Figure 1B:
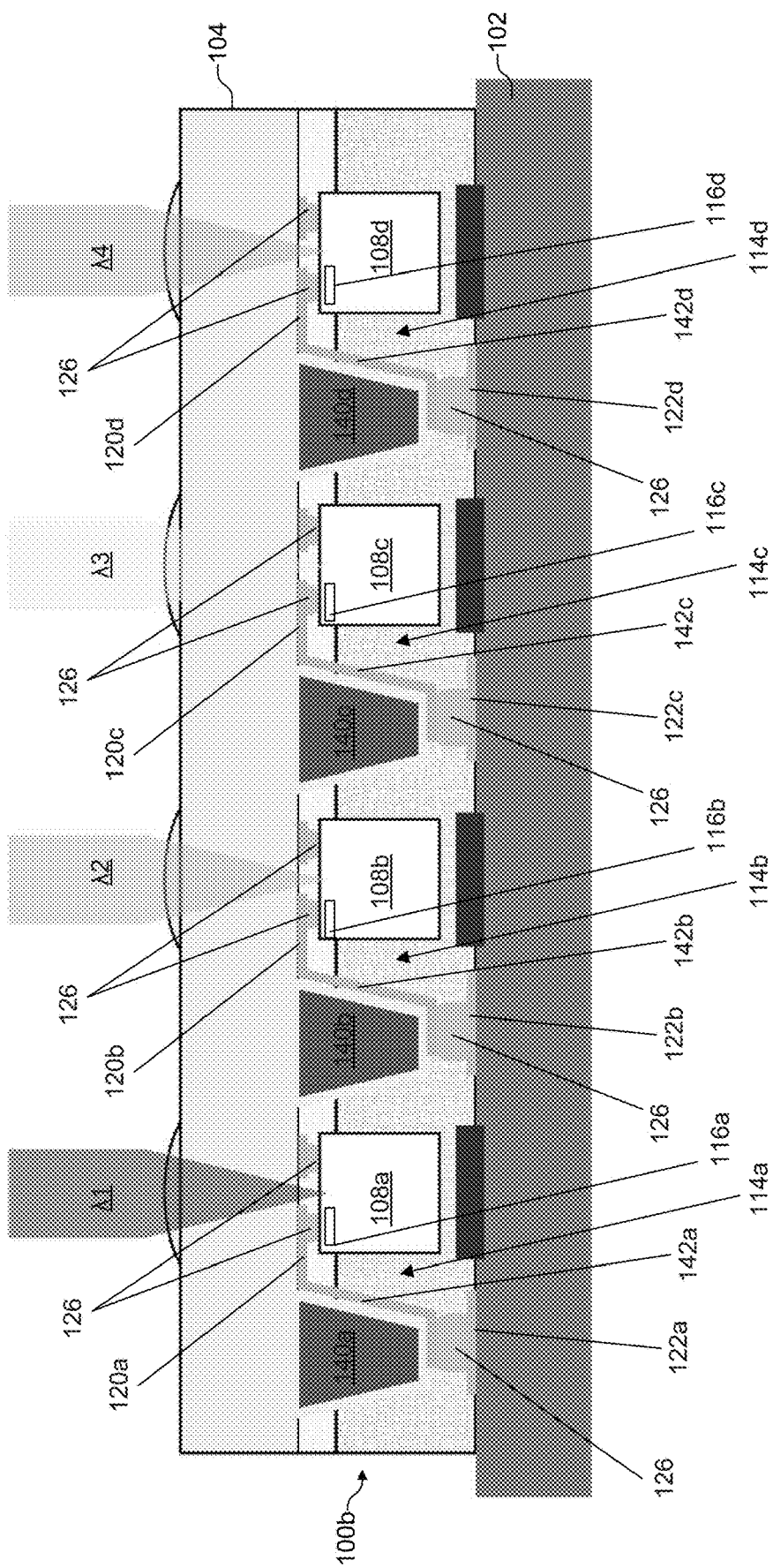
FIG. 1B schematically illustrates a section view of a block diagram of another example of an optical module according to the present disclosure.
Figure 1C:
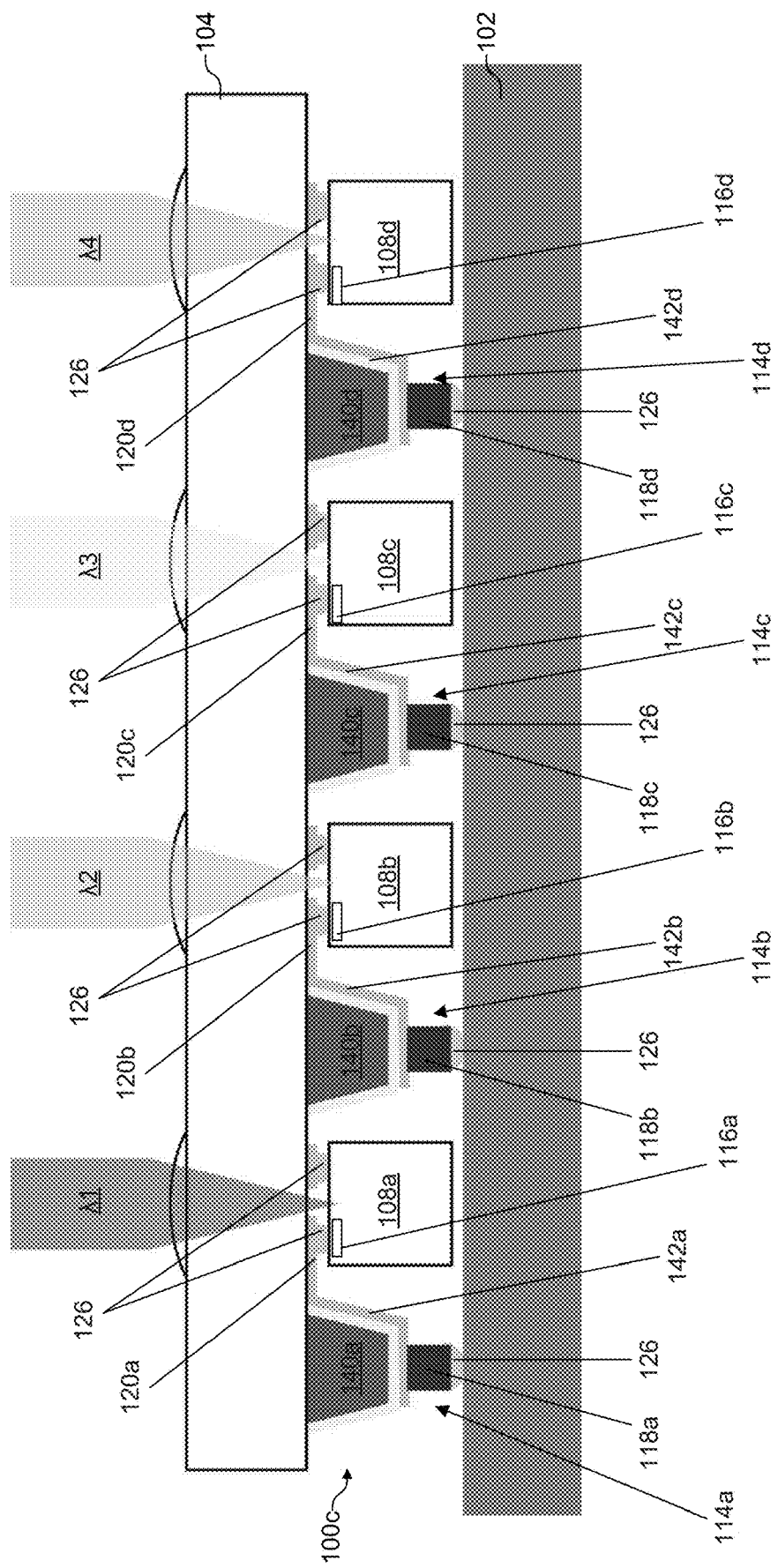
FIG. 1C schematically illustrates a section view of a block diagram of another example of an optical module according to the present disclosure.

FIGS. 1A-1C illustrate examples of optical modules 100 (identified individually as optical modules 100a-100c) and components thereof according to the present disclosure. Each of the optical modules 100a-100c can include one or more of any of the components or features, in whole or in part, of any of the features described herein with respect to each other. An optical module as described herein can include or form part of an optical transmitter (e.g., including top-emitting VCSELs), an optical receiver (e.g., including top-entry photodetectors), or both an optical transmitter and receiver. The optical module 100 includes a substrate 102 having opposing first and second sides (e.g., top and bottom sides). As described above, the substrate 102 can be an organic buildup substrate. The optical module 100 includes an interposer 104 having opposing first and second sides disposed over or above the substrate 102. The interposer 104 can be formed out of glass or other suitable material(s) with a relatively high-index of refraction. The interposer 104 can include a plurality of lenses 106 (identified individually as lenses 106a-106d) integrated on or otherwise formed on the first side of the interposer 104. For example, the lenses 106 may be fabricated via spin coating a polymer or other film on the interposer 104. While illustrated as protruding out in a convex manner, in other implementations, the lenses 106 can be recessed within the interposer 104.

The optical module 100 includes a plurality of top-emitting vertical-cavity surface-emitting lasers (e.g., VCSELs 108) flip-chipped to the second side of the interposer 104. As illustrated, the top-emitting VCSELs 108 are disposed between the substrate 102 and the interposer 104 and are configured to emit optical signals having different respective channels or wavelengths (e.g., $\lambda_1, \lambda_2, \lambda_3, \lambda_4$). The optical signals are configured to be combined and transmitted over a single optical fiber 110 (e.g., via a multiplexer 112), as described in more detail below. While illustrated as having four top-emitting VCSELs 108 (identified individually as VCSELs 108a, 108b, 108c, and 108d), the optical module 100 can include more than four top-emitting VCSELs (e.g., eight, sixteen, thirty-two, sixty-four) and emit additional wavelengths to be combined respectively (e.g., to increase overall bandwidth accordingly).

The optical modules described herein (e.g., optical modules 100a-100c, 200a-200c, and 400) can be optical transmitters, receivers, or transceivers. For example, the optical modules can include a plurality of top-emitting VCSELs, top-entry photodetectors, or both. With the use of top-emitting VCSELs or top-entry photodetectors rather than bottom-emitting VCSELs or substrate-entry photodetectors and the electrical and optical input/output (IO) configurations described herein, the optical modules can support wavelengths in both the one micron range (e.g., 980 nm to 1100 nm) for coarse wavelength division multiplexing (CWDM) as well as in the 850 nm range (e.g., 840 to 940 nm) for short wavelength division multiplexing (SWDM). Further, as top-emitting VCSELs or top-entry photodetectors are provided with the optical modules described herein, the top-emitting VCSELs or top-entry photodetectors can be fabricated with either transparent or non-transparent support substrate layers.

Further, as described above, the top-emitting VCSELs can be replaced or substituted with top-entry photodetectors configured to receive optical signals from the optical fiber and convert the optical signals to electrical signals for further processing. In the interest of clarity and to avoid unnecessarily obscuring the description, many of the various examples described herein refer to optical modules with top-emitting VCSELs. However, any of the example optical modules described herein can include top-entry photodetectors in addition to the top-emitting VCSELs (e.g., to form optical transceivers with transmitter and receivers) or in place of the top-emitting VCSELs (e.g., to form an optical receiver module).

The optical module 100 includes a plurality of electrical conductors 114 (e.g., identified individually as electrical conductors 114a-114d). Each of the electrical conductors 114 forms a respective electrical path between electrical contacts 116 (e.g., identified individually as electrical contacts 116a-116d) of respective top-emitting VCSELs 108 and the substrate 102. The electrical contacts 116 of each top-emitting VCSEL 108 include a pair of contacts (e.g., an anode contact and a cathode contact) disposed on a top side of the top-emitting VCSEL such that respective electrical paths extend or are routed from the top side of the top-emitting VCSEL 108 downward to the substrate 102. As described herein, the top side of the top-emitting VCSEL 108 refers to any VCSEL layers above a VCSEL support substrate of the top-emitting VCSEL 108. Typically, top-emitting VCSELs include one or more active layers sandwiched between upper and lower mirror layers built or otherwise formed on the support substrate. Therefore, by being disposed on the top side of the top-emitting VCSEL, the electrical contacts 116 are disposed above or over the support substrate.

As illustrated, only one of the pair of electrical contacts 116 (e.g., the cathode or anode contact) of each top-emitting VCSEL is shown or visible. In some examples and die layouts, the other non-visible electrical contact 116 of the pair of contacts in the section views herein (FIGS. 1A-2C) is disposed behind or in the same row or column as the visible electrical contact on a same lateral side of a mesa of the top-emitting VCSEL 108 (see FIG. 3A). In other examples or die layouts, the pair of electrical contacts 116 are disposed on opposite lateral sides of the top-emitting VCSEL 108 or mesa (see FIG. 3B).

With reference to FIG. 1A, in some examples, each of the electrical conductors 114 of optical module 100a can include electrically conductive metal pillars 118 (identified individually as metal pillars 118a-118d) such as solid metal pillars or metal lined pillars. The metal pillars 118 can be copper pillars or constructed out of other suitable metal material. The metal pillars 118 extend between and electrically couple respective first pads 120 (identified individually as first pads 120a-120d) disposed on the second side of the interposer 104 and respective second pads 122 (identified individually as second pads 122a-122d) disposed on the first side of the substrate 102. The metal pillars 118 can be fabricated or otherwise formed on the interposer 104. The metal pillars have heights (e.g., 175 to 225 micrometers) that are greater than heights of the top-emitting VCSELs 108 (e.g., 150 to 200 micrometers) to provide sufficient clearance for the top-emitting VCSELs 108 between the interposer 104 and substrate 102.

The pads as described herein (e.g., the first and second pads 120 and 122) can be, for example, solder attachment pads. Each of the first pads 120 are electrically coupled to one of the electrical contacts 116 (e.g., one of the anode or cathode contacts) of a respective top-emitting VCSEL 108 (e.g., via corresponding or matching pads or traces of the top-emitting VCSEL 108). The electrical metal pillars 118 thus form electrical paths between the respective electrical contacts 116 on top sides of the top-emitting VCSELs 108 and the substrate 102 thereunder. As discussed above, the optical module 100 includes other electrical contacts 116 (e.g., the other of the anode or cathode contacts) of the pair of electrical contacts (not shown in FIGS. 1A-1C or 2A-2C). These electrical contacts 116 are also electrically coupled to the substrate 102 via separate electrical conductors 114 extending between the substrate 102 and interposer 104.

The first pads 120 can be single pads (e.g., continuous pads) extending along the interposer 104 and attached to both the electrical conductors 114 and the top-emitting VCSELs 108. However, in other examples, the first pads 120 can include separate pads (e.g., two pads) configured to be coupled to the electrical conductors 114 and top-emitting VCSELS 108 respectively. The separate pads can be electrically coupled via conductive traces extending along or through the interposer 104.

The substrate 102 can also include conductive traces 128. The second pads 122 can be electrically coupled to an ASIC 130 or other suitable chip via the traces 128 (identified individually as traces 128a-128d) such that the ASIC 130 or other suitable chip can send electrical signals to respective top-emitting VCSELs 108 via the electrical paths between the substrate 102 and interposer 104 formed by the electrical conductors 114, pads (e.g., first and second pads 120 and 122, traces, and contacts 116. When the optical module 100 includes top-entry photodetectors, electrical signals converted from optical signals by the top-entry photodetectors can be sent to the ASIC 130 or other suitable chip via the electrical paths between the substrate 102 and interposer 104 for further processing.

As illustrated, the top-emitting VCSELs 108 (or top-entry photodetectors) can be mechanically coupled to respective first pads 120 via soldering (e.g., solder bumps 126 and corresponding solder reflow techniques). The optical module 100 can also include additional pads 124 (identified individually as pads 124a-124d) mechanically coupled to the respective top-emitting VCSELs 108 via soldering. Further, the metal pillars 118 can be mechanically coupled to respective second pads 120 via soldering as well. During a solder reflow process, the top-emitting VCSELs can be passively aligned with the respective lenses 106 (e.g., due to precise arrangement or position of the pads 120 and 124 on the interposer 104).

In some examples, an optical underfill layer 132 can be provided on the second side of the interposer 104 to reduce or prevent optical reflections. The optical underfill layer 132 is optically transparent and has an index of refraction matching or substantially matching that of the interposer 104. In some examples, the optical module 100 can include a thermally conductive underfill layer 134 under the optical underfill layer 132 to improve heat flow from the top-emitting VCSELs 108 to the substrate 102. Further, the first side of the substrate 102 can include heat spreaders 136 (identified individually as heat sinks 136a-136d) or heat sinks for distributing the heat from respective VCSELs 108.

As discussed above, the optical module 100 can include the multiplexer 112 and the optical fiber 110 or other suitable waveguide. Optical signals of varying wavelengths emitted by the top-emitting VCSELs 108 can be collimated by the respective lenses 106 and multiplexed or otherwise combined by the multiplexer 112 (e.g., a zig-zag multiplexer with a plurality of filters and reflectors). The combined optical signals can then be transmitted by the optical fiber 110 to, for example, another optical module, chip, or device. The optical module 100 can include an optical connector assembly (e.g., ferrule and socket) to couple the optical fiber 110 and multiplexer 112 to the interposer 104 or substrate 102. When the optical module 100 includes top-entry photodetectors, the multiplexer 112 can demultiplex optical signals transmitted to the optical module 100 via the optical fiber 110 to be received by the top-entry photodetectors. For example, opposing ends of the optical fiber 110 can be coupled to optical modules (e.g., optical transmitter and receiver modules, including top-emitting VCSELs and top-entry photodetectors, respectively).

With reference to FIG. 1B, in some examples, the optical module 100b includes a plurality of standoffs 140 (identified individually as standoffs 140a-140d) or posts disposed on the second side of the interposer 104. The standoffs 140 can be, for example, silicon (Si) standoffs bonded to or otherwise fabricated on the second side of the interposer 104. The standoffs 140 have heights (e.g., 175 to 400 micrometers) that are greater than heights of the top-emitting VCSELs 108 (e.g., 150 to 200 micrometers) to provide sufficient clearance for the top-emitting VCSELs 108 between the interposer 104 and substrate 102. The standoffs 140 extend between the interposer 104 and the substrate 102. While illustrated as having angled or slanted sidewalls, in other examples, the standoffs 140 can have vertical or substantially vertical sidewalls.

Each of the electrical conductors 114 includes conductive traces 142 (identified individually as conductive traces 142a-142d) extending along and supported by a respective standoff 140. The conductive traces 142 extend between and electrically couple respective first pads 120 (identified individually as first pads 120a-120d) disposed on the second side of the interposer 104 and respective second pads 122 (identified individually as second pads 122a-122d) disposed on the first side of the substrate 102. As described above, the first pads 120 are electrically coupled to one of respective electrical contacts 116 of the top-emitting VCSELs 108. The conductive traces 142 thus form electrical paths between the respective electrical contacts 116 on top sides of the top-emitting VCSELs 108 and the substrate 102 thereunder.

With reference to FIG. 1C, in some examples, the optical module 100c includes both the plurality of standoffs 140 disposed on the second side of the interposer 104 extending toward the substrate 102 and the metal pillars 118 as described above with respect to FIGS. 1A-1B. Each of the metal pillars 118 extends from a respective standoff 140 downward to the substrate 102. A combined height of the metal pillars 118 and standoffs 140 from which the metal pillars 118 extend is greater than a height of the top-emitting VCSELs 108 to provide sufficient clearance for the top-emitting VCSELs 108 between the interposer 104 and substrate 102. The metal pillars 118 can be shorter in height (e.g., 50 to 100 micrometers) relative to those illustrated in FIG. 1A as the standoffs 140 provide additional clearance height. In some examples, shorter metal pillars 118 may be easier to fabricate.

Each of the electrical conductors 114 includes a first portion (e.g., conductive traces 142) extending along respective standoffs 140 and a second portion (e.g., the metal pillars 118) electrically coupled to the first portion and extending from the respective standoff 140 to the substrate 102. The conductive traces 142 electrically couple respective first pads 120 to respective metal pillars 118. The conductive traces 142 extend along the respective standoff 140 to an opposing edge or side (e.g., under or rear side) of the standoff 140 opposite the second side bonded to the interposer 104 such that a portion of the conductive traces 142 is disposed between the opposing edge or side of the standoff 140 and the metal pillar 118. The metal pillar 118 electrically couples the respective conductive traces 142 to the respective second pads 122 (not illustrated in FIG. 1C) disposed on the first side of the substrate 102 (e.g., via solder bump 126 attachment). Thus, each of the electrical conductors 114 (e.g., the electrically coupled combination of conductive traces 142 and metal pillars 118) forms a respective electrical path between one of a respective electrical contact 116 on the top side of the top-emitting VCSELs 108 and the substrate 102 thereunder.

In some examples, each of the electrical conductors 114 includes a nanowire or nanotube. The nanowires extend between and electrically couple the respective first pads 120 disposed on the second side of the interposer 104 and the respective second pads 122 disposed on the first side of the substrate 102. Each of the first pads 120 are electrically coupled to one of the electrical contacts 116 of a respective top-emitting VCSEL 108. The nanowires can thus form electrical paths between the respective electrical contacts 116 on top sides of the top-emitting VCSELs 108 and the substrate 102 thereunder.

Figure 2A:
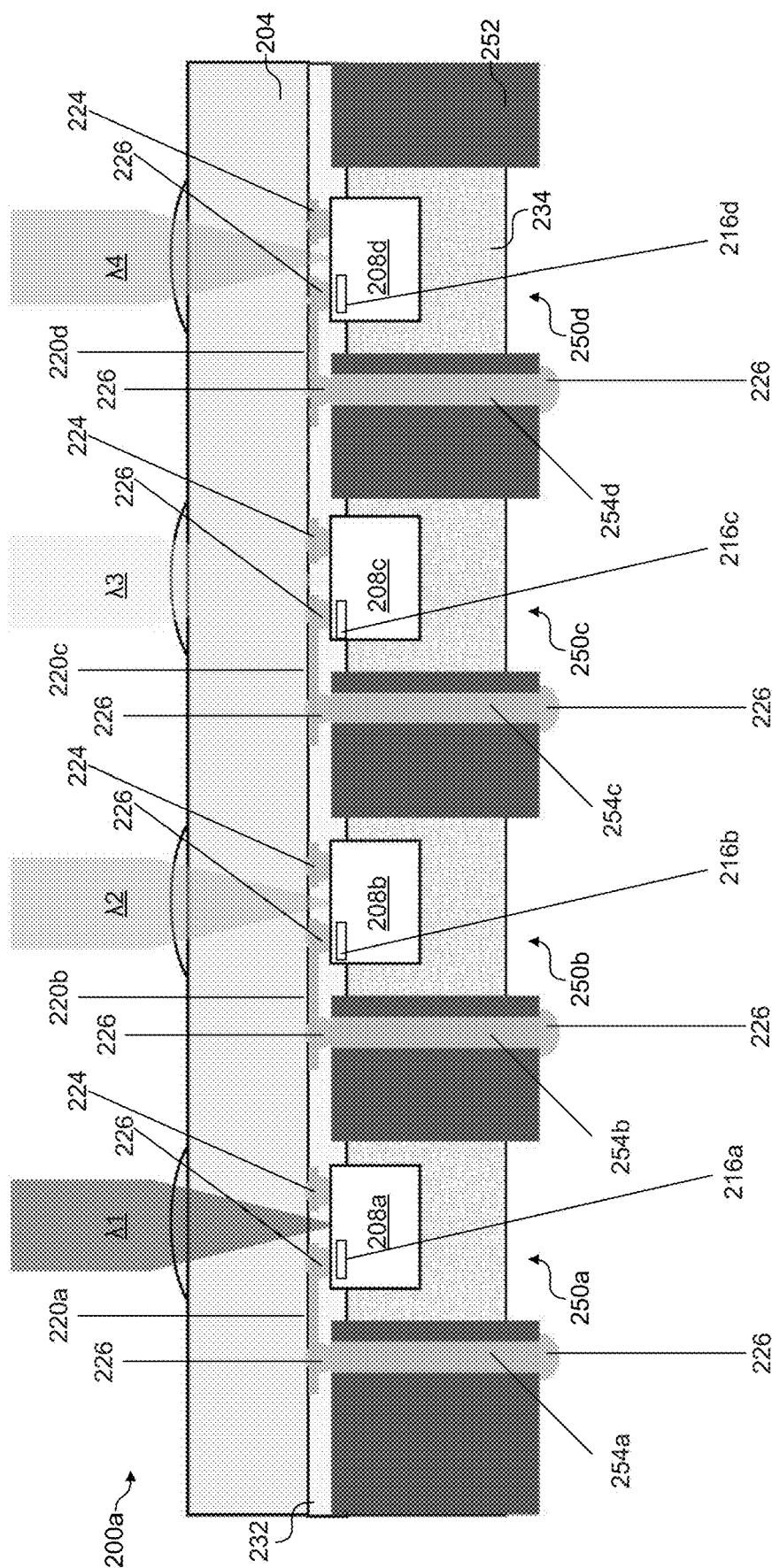
FIG. 2A schematically illustrates a section view of a block diagram of another example of an optical module according to the present disclosure.
Figure 2B:
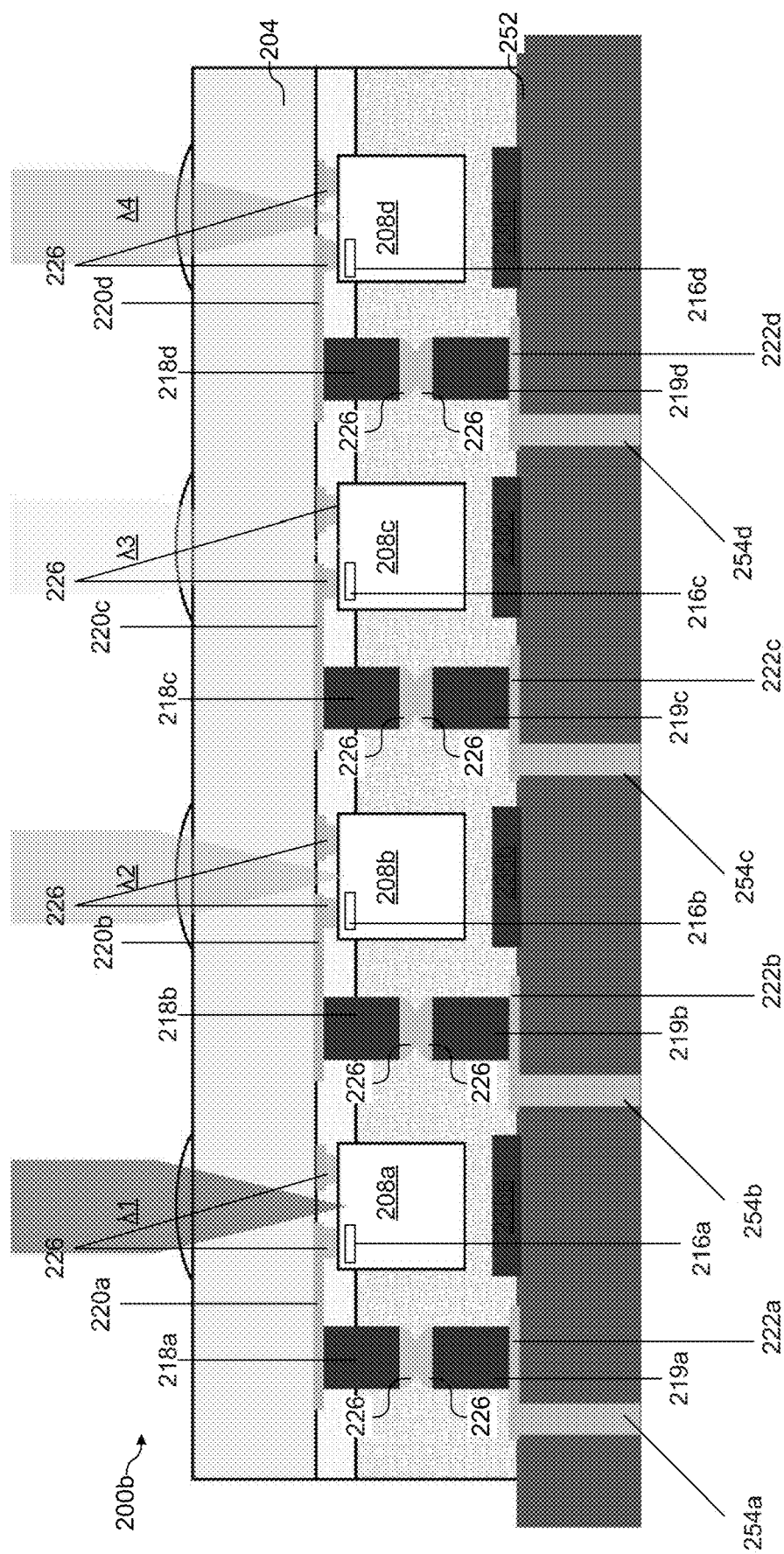
FIG. 2B schematically illustrates a section view of a block diagram of another example of an optical module according to the present disclosure.
Figure 2C:
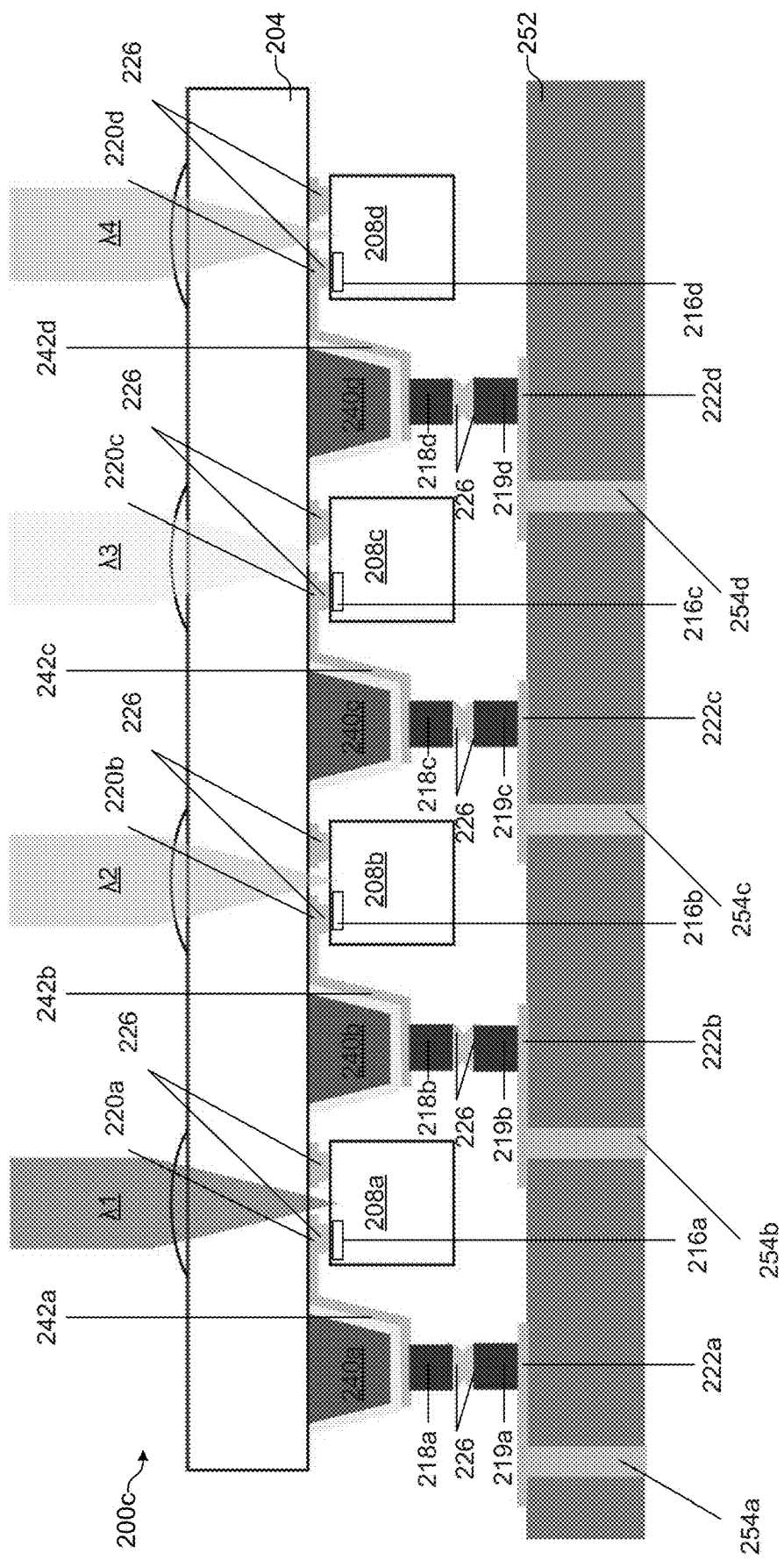
FIG. 2C schematically illustrates a section view of a block diagram of another example of an optical module according to the present disclosure.

FIGS. 2A-2C illustrate examples of optical modules 200 (identified individually as optical modules 200a-200c) and components thereof according to the present disclosure. Each of the optical modules 200a-200c can include one or more of any of the components or features, in whole or in part, of any of the features described herein with respect to each other as well as optical modules 100a-100c. For example, the optical modules 200 can include a first interposer 204 similar or identical to interposer 104 described above with respect to FIGS. 1A-1C. Further, the optical modules 200 each include a second interposer 252 with opposing first and second sides disposed below the first interposer 204 (e.g., the interposer 104). The second interposer 252 can be formed from Si, glass, or another suitable material. The optical modules 200 include the second interposer 252 thereunder (e.g., in place of or instead of the substrate 102 of the optical modules 100). The second interposer 252 can be disposed over or on a substrate (not illustrated in FIGS. 2A-2C) such as the substrate 102 described above with respect to FIGS. 1A-1C. In other examples, the second interposer 252 can be disposed directly over or on an integrated circuit, chip, die, or printed circuit board.

With reference to FIG. 2A, in some examples, the second interposer 252 of optical module 200a includes a plurality of trenches or cavities 250 (identified individually as cavities 250a-250d). The cavities 250 can be through holes in some examples. In other examples, the cavities 250 can be blind holes. Top-emitting VCSELs 208 are each disposed in a respective cavity 250. The electrical conductors of the optical module 200a can include vias 254 (identified individually as vias 254a-254d), for example, through substrate vias (TSVs). The second interposer 252 can have a thickness or height of up to 400 micrometers. In some examples, the second interposer 252 can have a thickness or height of 200 micrometers. In other examples, the second interposer 252 can have a thickness or height from 250 to 300 micrometers.

The vias 254 extend through the second interposer 252 to electrically couple respective first pads 220 (identified individually as first pads 220a-220d). The first pads 220 can be solder attachment pads disposed on the second side of the first interposer 204 to the second side of the second interposer 252. Opposing ends of the vias 254 can include solder bumps 226 to couple with the first pads 220 and a substrate (e.g., the substrate 102, integrated circuit (e.g., ASIC), chip, die, or printed circuit board), respectively, under the second interposer 252.

As described above with respect to the optical module 100, each of the first pads 220 are electrically coupled to one of a pair of the electrical contacts 216 on a top side of a respective top-emitting VCSEL 208. The vias 254 thus form electrical paths between or from the respective electrical contacts 216 on top sides of the top-emitting VCSELs 208 through the second interposer 252 to the substrate (e.g., the substrate 102, integrated circuit (e.g., ASIC), chip, die, or printed circuit board) thereunder. Additionally, as described above with respect to the optical module 100, the first pads 220 can be single pads extending along the interposer 204 and attached to both the electrical vias 254 and the top-emitting VCSELs 208. However, in other examples, the first pads 220 can include separate pads configured to be coupled to the vias 254 and top-emitting VCSELS 208 respectively. The separate pads can be electrically coupled via conductive traces extending along or through the interposer 204.

The optical modules 200 can include other features as described above with respect to the optical modules 100 as described herein. For example, the optical modules 200 can also include additional pads 224 mechanically coupled to the top-emitting VCSELs 208 via soldering (e.g., solder bumps 226 and corresponding solder reflow techniques). Additionally, the optical modules 200 can include an optical underfill layer 232 that is optically transparent and has an index of refraction matching or substantially matching that of the first interposer 204 or a thermally conductive underfill layer 234 under the optical underfill layer 232. The optical modules 200 can also include one or more heat spreaders 236a-236d. Further, the optical modules 200 can also include a multiplexer/demultiplexer to multiplex or demultiplex optical signals, an optical fiber or other suitable waveguide to transmit or receive the optical signals, as well as lenses 206 for collimating or focusing the optical signals.

With reference to FIG. 2B, in some examples, the optical module 200b includes the second interposer 252 as described above with respect to optical module 200a and FIG. 2A. The optical module 200b further includes a plurality of first metal pillars 218 (identified individually as first metal pillars 218a-218d) and a plurality of second metal pillars 219 (identified individually as second metal pillars 219a-219d). The first and second metal pillars 218 and 219 can be configured identically or similarly as metal pillar 118 of optical modules 100. For example, the first metal pillars 218 are fabricated on or otherwise formed on the second side of the first interposer 204. Each of the first metal pillars 218 extends downward (e.g., towards the second interposer 252 under the first interposer 204) from respective first pads 220 disposed on the second side of the first interposer 204 between the first metal pillars 218 and the first interposer 204.

The second metal pillars 219 are fabricated on or otherwise formed on the first side of the second interposer 252. Each of the second metal pillars 219 extends upward (e.g., towards the first interposer 204 above the second interposer 252) from respective second pads 222 (identified individually as second pads 222a-222d) disposed on the first side of the second interposer 252 between the second metal pillars 219 and the second interposer 252. The first and second metal pillars 218 and 219 are in "face-to-face" contact with each other. That is opposing ends of the first and second metal pillars 218 and 219 opposite of the respective interposers they are fabricated on are coupled together. Respective first and second metal pillars 218 and 219 are coupled together (e.g., via respective solder bumps 226) such that they are in vertical or substantial vertical alignment with each other. Having two or more metal pillars (e.g., pillars 218 and 219) extending from respective interposers and coupled together allows the metal pillars to be shorter in height (e.g., 80 to 115 micrometers) relative to a single metal pillar (e.g., 175 to 225 micrometers) to provide sufficient clearance between the first and second interposers 204 and 254 for the respective top-emitting VCSELs 208. Metal pillars shorter in height may be easier to fabricate.

As described above with respect to optical module 200a, the interposer 252 includes vias 254 extending through the second interposer 252. The vias 254 can extend from the respective second pads 222 disposed on the first side of the second interposer 252 to the second side of the second interposer 252. While not illustrated in FIG. 2B, the ends of the vias 254 at the second side of the second interposer 252 can include respective solder bumps 226 to couple to a substrate (e.g., the substrate 102, integrated circuit (e.g., ASIC), chip, die, or printed circuit board), respectively, under the second interposer 252. Further, as described above with respect to the first pads 120 of optical modules 100, the first and second pads 220 and 222 of optical modules 200 can be single pads or separate pads coupled together via electrically conductive traces.

Each of the first pads 220 are electrically coupled to one of the pair of electrical contacts 216 on a top side of respective top-emitting VCSELs 208. The electrical conductors of the optical module 200b including the electrically coupled first and second metal pillars 218 and 219 and the vias 254 form electrical paths between or from the respective electrical contacts 216 on top sides of the top-emitting VCSELs 208 through the second interposer 252 to the substrate (e.g., the substrate 102, integrated circuit (e.g., ASIC), chip, die, or printed circuit board) thereunder.

With reference to FIG. 2C, in some examples, the optical module 200c includes the second interposer 252 as described above with respect to optical modules 200a and 200b as well as the plurality of first metal pillars 218 and second metal pillars 219. The optical module 200c further includes a plurality of standoffs 240 (identified individually as standoffs 240a-240d) disposed on the second side of the first interposer 204 extending downward toward the second interposer 252. The standoffs 240 can be configured identically or similarly as standoffs 140 described above bonded to or otherwise formed on the second side of the first interposer 204.

As illustrated, the first pillars 218 are fabricated on or otherwise formed an under or rear side of respective standoffs 240. Each of the first metal pillars 218 extends downward (e.g., towards the second interposer 252 under the first interposer 204). The second metal pillars 219 are fabricated on or otherwise formed on the first side of the second interposer 252. Each of the second metal pillars 219 extends upward (e.g., towards the first interposer 204 above the second interposer 252) such that first and second metal pillars 218 and 219 are in "face-to-face" contact with each other.

Respective first and second metal pillars 218 and 219 can be coupled together (e.g., via respective solder bumps 226) such that they are in vertical or substantial vertical alignment with each other as described above with respect to the metal pillars of optical module 200b. By including standoffs 240, the heights of the first and second metal pillars 218 and 219 can be further reduced or decreased relative to single metal pillars as well as the metal pillars of optical module 200b as the standoffs 240 provide additional clearance height between the interposers 204 and 252. For example, with standoffs 240 having heights of 125 micrometers, the metal pillars 218 and 219 can have heights of 25 micrometers each such that sufficient clearance is provided for top-emitting VCSELs of 150 micrometers in height to be disposed between the interposers 204 and 252.

Each of the electrical conductors of the optical module 200c includes conductive traces 242 (identified individually as conductive traces 242a-242d). The conductive traces 242 can be configured identically or similarly as conductive traces 142 described above with respect to optical modules 100b and 100c. For example, the conductive traces 242 extend from the first pads 220 disposed on the second side of the first interposer 204 and along respective standoffs 240. The conductive traces 242 electrically couple respective first pads 220 to respective metal pillars 218 extending from the standoffs 240. The conductive traces 242 extend along the respective standoffs 240 to an opposing edge or side (e.g., under or rear side) of the standoff 240 opposite the second side bonded to the interposer 240 such that a portion of the conductive traces 242 is disposed between the opposing edge or side of the standoff 240 and the metal pillar 218.

The metal pillars 218 and 219 electrically couple the respective conductive traces 242 to the respective second pads 222 disposed on the first side of the second interposer 252. Each of the first pads 220 are electrically coupled to one of the pair of electrical contacts 216 on a top side of respective top-emitting VCSELs 208. The second interposer 252 can include vias 254 as described herein. Thus, the electrical conductors of the optical module 200c including the electrically coupled first and second metal pillars 218 and 219, conductive traces 242, and the vias 254 form electrical paths between or from the respective electrical contacts 216 on top sides of the top-emitting VCSELs 208, along the respective standoffs 240, through the second interposer 252, and to a substrate (e.g., the substrate 102, integrated circuit (e.g., ASIC), chip, die, or printed circuit board) thereunder.

Figure 3A:
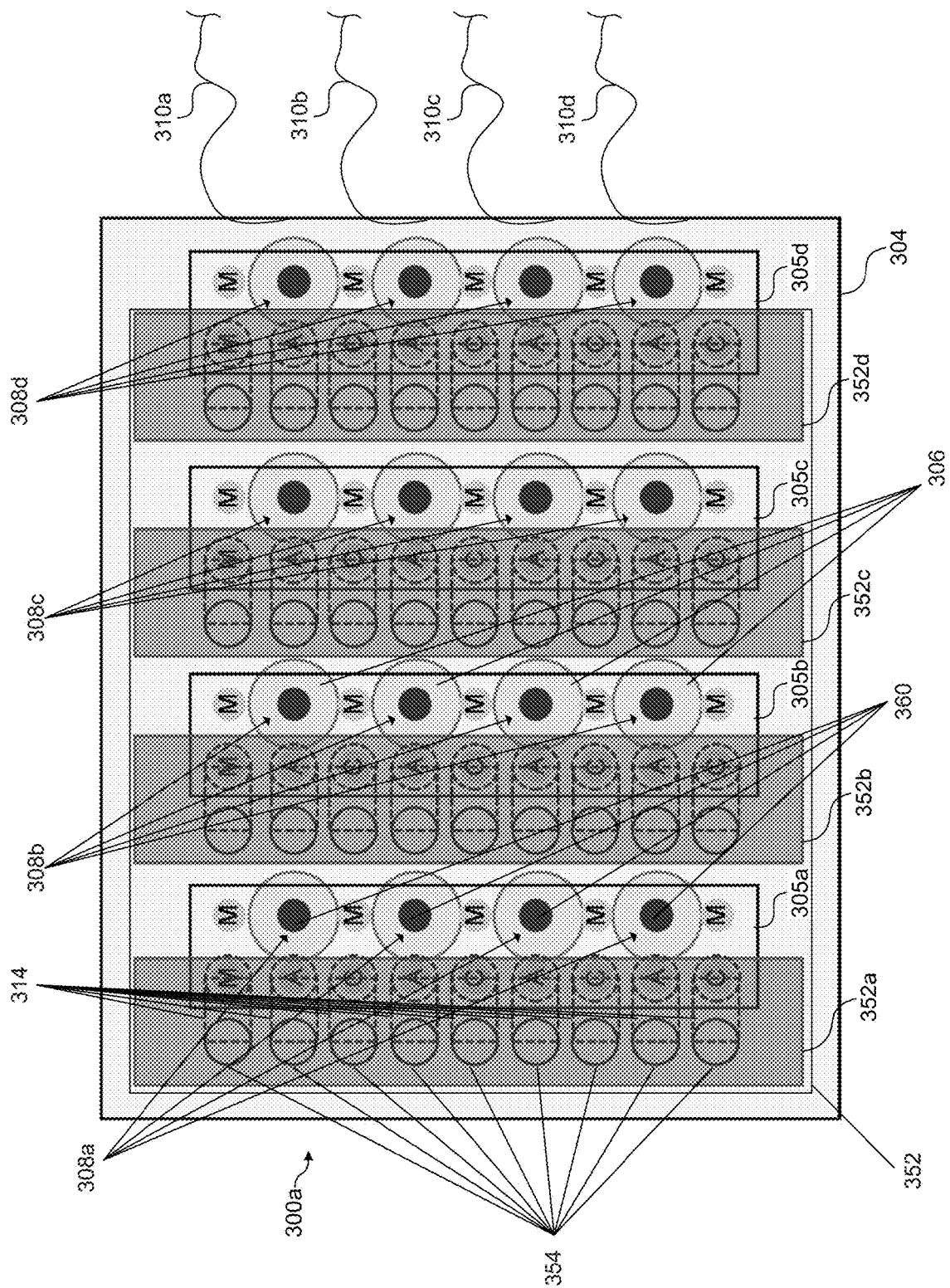
FIG. 3A schematically illustrates a top section view of a block diagram of an example die layout of an array of optical modules according to the present disclosure.
Figure 3B:
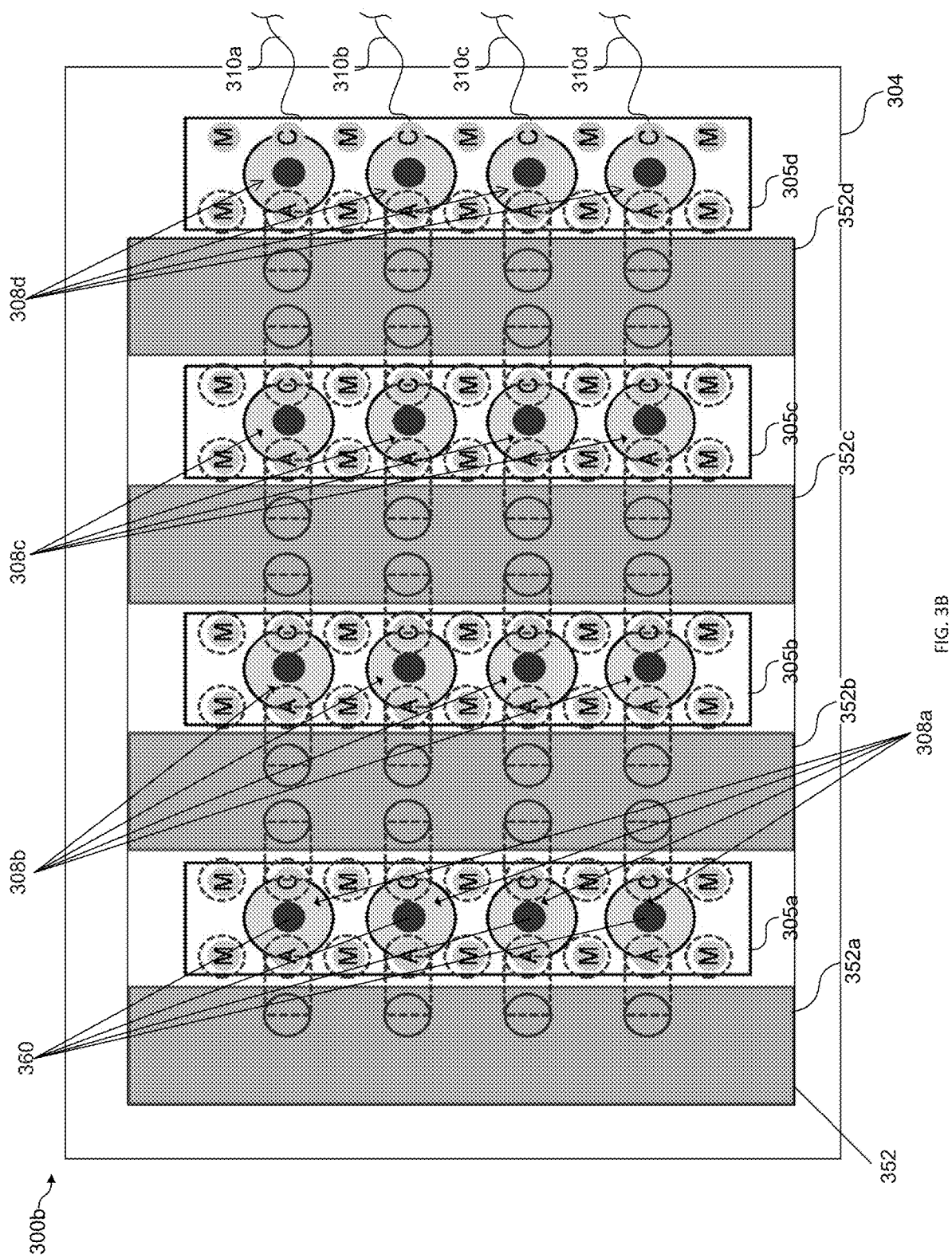
FIG. 3B schematically illustrates a top section view of a block diagram of another example die layout of an array of optical modules according to the present disclosure.

Referring to FIGS. 3A-3B, top section views of example die or package layouts of arrays of the optical modules as described herein (e.g., optical modules 100a-100c, 200a-200c) are illustrated. As described above, top-emitting VCSELs 308 can be replaced with top-entry photodetectors such that the optical transmitter or receivers can be constructed as desired. The die layouts 300a and 300b can include sixteen top-emitting VCSELs 308 (e.g., in a 4×4 arrangement or layout) such that optical signals from each set or group of four top-emitting VCSELs 308 (identified individually as VCSELs 308a-308d) with different wavelengths (e.g., $\lambda_1, \lambda_2, \lambda_3, \lambda_4$) are configured to be multiplexed or otherwise combined to be transmitted over a respective optical fiber 310 (identified individually as optical fibers 310a-310d). In other examples, the die layouts 300a and 300b can include more or less than sixteen top-emitting VCSELs 308. Each top-emitting VCSEL 308 includes an active mesa 360 and light emitted from the top-emitting VCSELs 308 can be collimated by a lens 306 to be multiplexed as described above.

Each top-emitting VCSEL 308 is flip-chipped or otherwise coupled to a first interposer or substrate 304 (e.g., interposer 204 or substrate 104 as described herein) via mechanical attachments M (e.g., pads 124 or 224 and corresponding solder bumps). As described above, different channels or wavelengths (e.g., $\lambda_1, \lambda_2, \lambda_3, \lambda_4$) of each set or group of top-emitting VCSELs 308 can be combined and transmitted over a respective optical fiber 310. The VCSELs 308 configured to emit the same wavelength can be coupled to or otherwise formed on the same chip or VCSEL support substrate 305 (identified as VCSEL support substrates 305a-305d) and then flip-chipped to the first interposer or substrate 304. For example, the VCSELs 308a configured to emit wavelength $\lambda_1$ can be formed on the same VCSEL support substrate 305a, the VCSELs 308b configured to emit wavelength $\lambda_2$ can be formed on the same VCSEL support substrate 305b, the VCSELs 308c configured to emit wavelength $\lambda_3$ can formed on the same VCSEL support substrate 305c, and the VCSELs 308d configured to emit wavelength $\lambda_4$ can be formed on the same VCSEL support substrate 305d.

Each top-emitting VCSEL 308 includes a pair of electrical contacts (e.g., identified as anode contact A and cathode contact C). The electrical contacts can be electrically coupled to a second interposer or substrate 352 (e.g., interposer 252 or substrate 102 as described herein) under the first interposer or substrate 304 via electrical conductors 314. As described above with respect to the second interposer or substrate 252, the second interposer or substrate 352 can include a plurality of cavities or trenches spacing apart or between portions or sections of the second interposer or substrate 352 (identified individually as second interposer or substrate sections 352a-352d). With reference to FIG. 3A, in some examples, the pairs of electrical contacts of the VCSELs 308 can be disposed or positioned on a same lateral side of respective active mesas 360 of the VCSELs 308. With reference to FIG. 3B, in other examples, the pairs of electrical contacts of the VCSELs 308 can be disposed or positioned on opposing lateral sides of the respective active mesas 360 of the VCSELs 308.

The electrical conductors 314 can be configured according to any of the electrical conductors described herein with respect to optical modules 100a-100c, 200a-200c. For example, as illustrated in FIGS. 3A-3B, the electrical conductors 314 can include vias 354 extending through the second interposer or substrate 352 to form electrical paths between the electrical contacts on a top-side of each top-emitting VCSEL 308 and the second side (e.g., under or rear side) of the second interposer or substrate 352 thereunder. As described above, the electrical paths can include corresponding pads and traces between the electrical contacts and vias. Further in some examples, the electrical conductors 314 can electrically couple the electrical contacts to a substrate (e.g., the substrate 102, integrated circuit (e.g., ASIC), chip, die, or printed circuit board) under the second interposer or substrate 352.

Figure 4:
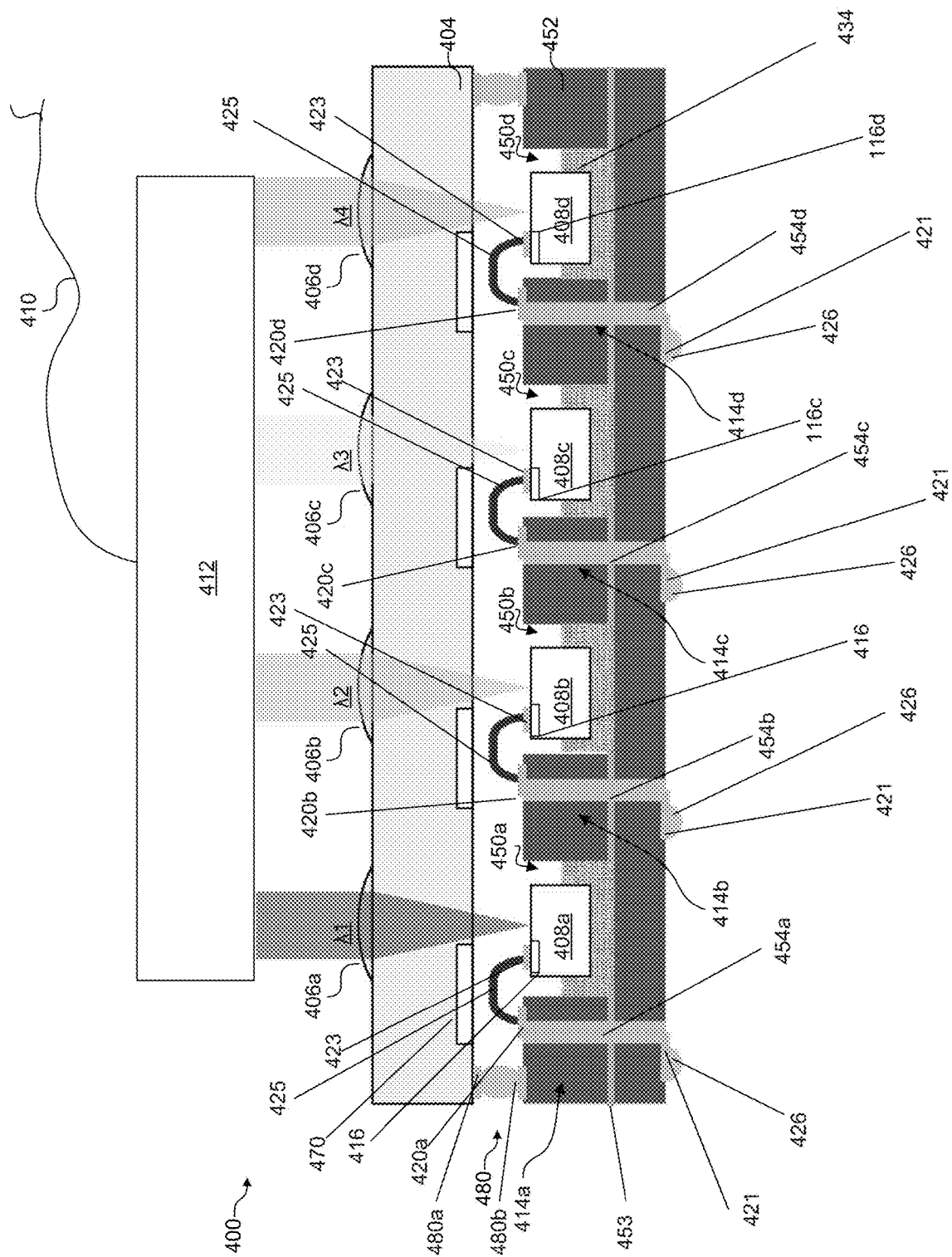
FIG. 4 schematically illustrates a section view of a block diagram of another example of an optical module according to the present disclosure.

FIG. 4 illustrates an example optical module 400 and components thereof according to the present disclosure. The optical module 400 can include one or more of any of the components or features, in whole or in part, of any of the features described herein with respect to any of optical modules 100a-100c or 200a-200c. For example, the optical module 400 can include a first interposer 404 with opposing first and second sides (e.g., top and bottom or front and back surfaces, respectively) similar or identical to interposer 104 described above with respect to FIGS. 1A-1C or first interposer 204 described above with respect to FIGS. 2A-2C. For example, the first interposer 404 can be constructed of glass or other suitable materials with a relatively high-index of refraction (e.g., GaAs, GaP, GaN, InP). The first interposer 404 is constructed of a material transparent to a range of wavelengths to be transmitted therethrough. The first interposer 404 can be a passive glass interposer. First and second sides of the first interposer 404 can include anti-reflective coatings. In some examples, the first interposer 404 includes cavities 470 at the second side to accommodate respective wire bonds 425 as described in more detail below.

Further, the optical module 400 includes a second interposer 452 with opposing first and second sides (e.g., top and bottom or front and back surfaces, respectively) disposed below the first interposer 404 (e.g., the interposer 104 or the first interposer 204). The second interposer 452 can be formed from Si, SOI, or another suitable material or combination of materials.

The optical module 400 includes the second interposer 452 thereunder (e.g., in place of or instead of the substrate 102 of the optical modules 100). However, the second interposer 400 can be disposed directly over or on a substrate (not illustrated in FIG. 4) such as the substrate 102 described above with respect to FIGS. 1A-1C. In other examples, the second interposer 452 can be disposed directly over or on an integrated circuit, chip, die, or printed circuit board. In this manner, the optical module 400 is flip chip capable (e.g., the optical module 400 can be flip-chip assembled to a substrate or other circuit, chip, board, or die thereunder). The second interposer 452 can have a thickness or height of up to 400 micrometers. For examples, the second interposer 452 can have a thickness or height of 200 micrometers or 300 micrometers. In other examples, the second interposer 452 can have a thickness or height from 100 to 300 micrometers or from 300 to 350 micrometers.

As illustrated, in some examples, the second interposer 452 of optical module 400 includes a plurality of trenches or cavities 450 (identified individually as cavities 450a-450d). The cavities 450 can be through holes in some examples (e.g., extending completely through the second interposer 452 from the first side to the second side). In other examples, the cavities 450 can be blind holes (e.g., extending from the first side to an elevation spaced away from or above the second side). For example, the second interposer 452 can include an etch-stop layer 453 such that blind hole cavities 450 are formed during processing (e.g., via DRIE) rather than through hole cavities. In such examples, the second interposer 452 can be formed from an SOI wafer with the etch-stop layer 453 being a BOX layer of the second interposer 452.

The cavities 450 can act as landing sites or locations within the second interposer 452 for respective top-emitting VCSELs 408 (identified individually as top-emitting VCSELs 408a-408d) or top-entry photodetectors to be positioned therein. For example, the top-emitting VCSELs 408 (e.g., or top-entry photodetectors) can each be disposed in a respective cavity 450 and coupled or otherwise bonded therein to the second interposer 452 (e.g., with thermally conductive glue or solder) such that the top-emitting VCSELs 408 (e.g., or top-entry photodetectors) are affixed on or to the second interposer 452. The top-emitting VCSELs 408 (e.g., or top-entry photodetectors) can be positioned within the respective cavities 450 via vision alignment. Alternatively, the top emitting VCSELs may be precisely positioned by placing the VCSELs 408 against the sidewalls and bottom surface of the cavity 450.

Top surfaces of the top-emitting VCSELs 408 (e.g., or top-entry photodetectors) can then be aligned with the first side or top surface of the second interposer 452 prior to coupling the top-emitting VCSELs 408 (e.g., or top-entry photodetectors) thereto. For example, a die bonder equipped with alignment mechanisms (e.g., a collet with a touch probe, optical proximity sensor) can be used to align the top-emitting VCSELs 408 (e.g., or top-entry photodetectors) with the second interposer 452 prior to coupling the top-emitting VCSELs 408 (e.g., or top-entry photodetectors) thereto within the cavities 450. A vertical distance between active regions of the VCSELs 408 and micro lenses on the first interposer 404 (e.g., as described in more detail below) can be properly maintained with such alignment and bonding techniques. In some examples, each of the cavities 450 can include a thermally conductive underfill 434 (e.g., similar to underfill 134 as described above) to improve heat flow to the second interposer 452 from the VCSELs 408 or help maintain the VCSELs in position within the respective cavities 450.

The optical module 400 includes electrical conductors 414 (identified individually as electrical conductors 414a-414d). The electrical conductors 414 of the optical module 400 route electrical input/output (IO) from a top side of respective top-emitting VCSELs 408 (e.g., or top-entry photodetectors) to a second side or bottom surface of the second interposer 452 (e.g., to a respective solder bump 426 or an array of solder bumps such that optical module 400 can be, for example, flip-chip assembled to a substrate or other circuit, chip, board, or die as described above). The electrical conductors 414 include vias 454 (identified individually as vias 454a-454d), for example, through substrate vias (TSVs).

The vias 454 extend through the second interposer 452 to electrically couple respective first pads 420 (identified individually as first pads 420a-420d) on the first side of the second interposer 452 to the solder bumps 426 at the second side of the second interposer 452. For example, the first pads 420 can be wirebond pads disposed on the first side of the second interposer 452 electrically coupled with respective solder bumps 426 on the second side of the second interposer 452 by the vias 454. Ends of the vias 454 opposite the first pads 420 can include bump pads 421. Further, in some examples, the second side of the second interposer 452 can include a redistribution layer (e.g., RDL) such that the solder bumps 426 or bump pads 421 can be disposed away from or offset (e.g., horizontally) from the first pads 420 or vias 454 to allow improved accessibility as desired to the electrical 10 at the second side of the interposer 452 (e.g., to flip-chip assemble the optical module 400 to a substrate or other circuit, chip, board, or die via the solder bumps 426).

Each of the first pads 420 are electrically coupled to one of a pair of electrical contacts 416 on a top side of a respective top-emitting VCSEL 408 (e.g., or top-entry photodetectors as described herein). For example, each of the top-emitting VCSELs 408 can include respective complementary or corresponding wire bond pads 423 in electrical communication with the electrical contacts 416. The corresponding or complementary wire bond pads 423 of the top-emitting VCSELs 408 can be electrically coupled to respective first pads 420 (e.g., via respective wire bonds 425). The vias 454 electrically couple the first pads 420 to respective solder bumps 426 through the second interposer 452 as described above. The electrical conductors 414 thus form electrical paths between or from the respective electrical contacts 416 on top sides of the top-emitting VCSELs 408 to the first side of the second interposer 452 and through the second interposer 452 to the second side of the second interposer 452 (e.g., the solder bumps 426).

In some examples, the optical module 400 can include a hermetic sealing ring 480 between the first interposer 404 and the second interposer 452 configured to solder self-align the respective interposers together. The hermetic sealing ring 480 can include complementary or corresponding ring portions formed on the first and second interposers, respectively (e.g., identified as hermetic sealing ring portions 480a and 480b, respectively). The complementary ring portions can be soldered together. The hermetic sealing ring 480 can also protect the active regions of the top-emitting VCSELs 408 or top-entry photodetectors or the wire bonds 425 from exposure or damage from the environment or user contact in the field. In other examples, the optical module 400 can include an optical underfill layer (e.g., layer 132 as described above with respect to other examples) between the interposers that is optically transparent and has an index of refraction matching or substantially matching that of the first interposer 404 without a hermetic sealing ring. In such examples, the optical module can also include the thermally conductive underfill layer 434 under the optical underfill layer as described herein.

The optical module 400 can include other features as described above with respect to the optical modules 100a-100c or 200a-200c as described herein. For example, the optical module 400 can also include a plurality of lenses 406 (e.g., micro lenses) for collimating or focusing the optical signals respectively transmitted or received through the first interposer 404. The plurality of lenses 406 (identified individually as lenses 406a-406d) can be integrated on or otherwise formed on the first side of the interposer 404. For example, the lenses 406 may be fabricated via spin coating a polymer or other film on the interposer 404, machined, or etched into the interposer 404. While illustrated as protruding out in a convex manner, in other implementations, the lenses 406 can be recessed within the interposer 404.

The plurality of top-emitting vertical-cavity surface-emitting lasers (e.g., VCSELs 408) are configured to emit optical signals having different respective channels or wavelengths (e.g., $\lambda_1, \lambda_2, \lambda_3, \lambda_4$). The optical signals are configured to be combined and transmitted over a single optical fiber 410 (e.g., via a multiplexer/demultiplexer 412), as described herein. While illustrated as having four top-emitting VCSELs 408 (identified individually as VCSELs 408a, 408b, 408c, and 408d), the optical module 400 can include more than four top-emitting VCSELs (e.g., eight, sixteen, thirty-two, sixty-four) and emit additional wavelengths to be combined respectively (e.g., to increase overall bandwidth accordingly). A complementary or corresponding optical module (e.g., an optical receiving module) with top-entry photodetectors in place of the top-emitting VCSELs 408 can be coupled to an opposing or second end of the optical fiber 410 to receive the optical signals from the optical module 400 coupled to the first end of the optical fiber 410 and convert the optical signals to electrical signals for processing.

An example method of assembling or fabricating the optical module 400 is described herein. The method can include one or more of any of the following steps. The method can include forming pads (e.g., wire bond pads), a first complementary portion of a hermetic sealing ring, etched landing sites or cavities (e.g., via DRIE) for the top-entry photodetectors or top-emitting VCSELs on the first side of the second interposer. The depth of the cavities may be different for each VCSEL and photodetector. Through substrate vias can be formed through the second interposer to electrically connect or couple the pads on the first side of the second interposer to solder bumps on the second side of the second interposer. The top-entry photodetectors or top-emitting VCSELs can be positioned within the landing sites via vision alignment and affixed or otherwise bonded to the second interposer to the landing sites (e.g., with thermally conductive glue or solder).

As described above, a die bonder can be used to align the top surface of the top-entry photodetectors or top-emitting VCSELs with the first side of the second interposer prior to bonding the top-entry photodetectors or top-emitting VCSELs thereto. As such spacing or vertical distance between active regions of the top-entry photodetectors or top-emitting VCSELs and the first interposer can be selected and maintained. Wire bonds can be formed between wire bond pads of the top-entry photodetectors or top-emitting VCSELs and the pads on the first side of the second interposer such that an electrical path is formed between the top-entry photodetectors or top-emitting VCSELs and the second side of the second interposer. The wire bonds can be formed using conventional high speed wire bonders in some examples.

The method can further include solder self-aligning a second complementary portion of the hermetic sealing ring on the second side of the first interposer with the first complementary portion of the hermetic sealing ring to couple the first and second interposers and seal the wire bonds and top-entry photodetectors or top-emitting VCSELs from the environment or user interaction after the electrical conductors are formed. As described above, the first interposer can be previously provided with or processed to include a plurality of lenses or cavities for the wire bonds prior to being coupled to the second interposer. In some examples, when the optical module does not include the hermetic sealing ring, the method can include injecting the optical underfill between the respective interposers to couple or otherwise bond the first and second interposers. After the first and second interposers are coupled or otherwise bonded together, the method can include flip chip assembling the optical module to a substrate or other circuit, chip, board, or die, as described above.

In the foregoing description, numerous details are set forth to provide an understanding of the subject disclosed herein. However, implementations may be practiced without some or all of these details. Other implementations may include additions, modifications, or variations from the details discussed above. It is intended that the appended claims cover such modifications and variations. The specification and drawings are, accordingly, to be regarded as illustrative rather than restrictive. Additionally, in the interest of clarity and to avoid unnecessarily obscuring the description, other details describing well-known structures and systems often associated with optical modules (e.g., VCSEL contact pads, traces between pads, driver circuitry), have not been set forth herein in the description of the various examples of the present disclosure.

It will be recognized that the terms "comprising," "including," and "having," as used herein, are specifically intended to be read as open-ended terms of art. The term "or," in reference to a list of two or more items, covers all of the following interpretations of the word: any of the items in the list, all of the items in the list, and any combination of the items in the list. As used herein, the terms "connected," "coupled," or any variant thereof means any connection or coupling, either direct or indirect (e.g., having additional intervening components or elements), between two or more elements, nodes, or components; the coupling or connection between the elements can be physical, mechanical, logical, optical, electrical, or a combination thereof.

In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1.

The invention claimed is:

1. An optical transmitter module comprising:
a first interposer having opposing first and second sides;
a second interposer having opposing first and second sides;
a plurality of top-emitting vertical-cavity surface-emitting lasers (VCSELs) coupled to the second interposer, the top-emitting VCSELs configured to emit optical signals having different wavelengths through the first interposer, the optical signals configured to be combined and transmitted over a single optical fiber; and
a plurality of electrical conductors forming electrical paths between electrical contacts of the top-emitting VCSELs and the second side of the second interposer, wherein the second interposer includes a plurality of cavities, wherein each of the top-emitting VCSELs is disposed in a respective cavity, and wherein each of the electrical conductors extends through the second interposer to electrically couple respective first pads disposed on the first side of the second interposer to a respective solder bump on the second side of the second interposer, each of the first pads electrically coupled to one of the electrical contacts of a respective top-emitting VCSEL.

2. The optical module of claim 1, wherein the electrical contacts of each top-emitting VCSEL include an anode contact and a cathode contact disposed on a top side of the top-emitting VCSEL such that respective electrical paths extend from the second interposer to the top-side of the top-emitting VCSEL.

3. The optical module of claim 1 wherein each of the cavities are blind holes formed through the second interposer.

4. The optical module of claim 3, wherein each of the cavities include a thermally conductive underfill layer therein.

5. The optical module of claim 1, wherein the electrical conductors comprise vias extending through the second interposer electrically coupling respective first pads disposed on the first side of the second interposer to respective solder bumps on the second side of the second interposer.

6. The optical module of claim 1, wherein each of the top-emitting VCSELs includes a wire bond pad, each of the wire bond pads electrically coupled to respective electrical contacts of the top-emitting VCSELs, and wherein each of the wire bond pads are electrically coupled to respective first pads disposed on the first side of the second interposer via respective wire bonds.

7. The optical module of claim 6, wherein the second side of the first interposer includes a plurality of cavities configured to allow a respective wire bond to extend therein when the first interposer is bonded to the second interposer.

8. The optical module of claim 1, wherein the first interposer is a glass interposer.

9. The optical module of claim 8, further comprising a plurality of lenses on the first side of the first interposer.

10. The optical module of claim 1, further comprising a hermetic sealing ring extending from the second side of the first interposer to the first side of the second interposer configured to solder self-align the first interposer to the second interposer.

11. An optical receiving module comprising:
a first interposer having opposing first and second sides;
a second interposer having opposing first and second sides;
a plurality of top-entry photodetectors coupled to the second interposer, the top-entry photodetectors configured to receive optical signals having different wavelengths through the first interposer, the optical signals configured to be received from a single optical fiber and demultiplexed such that each of the top-entry photodetectors receives an optical signal with a different respective wavelength; and
a plurality of electrical conductors forming electrical paths between electrical contacts of the top-entry photodetectors and the second side of the second interposer, wherein the second interposer includes a plurality of cavities, wherein each of the top-entry photodetectors is disposed in a respective cavity, and wherein each of the electrical conductors extends through the second interposer to electrically couple respective first pads disposed on the first side of the second interposer to a respective solder bump on the second side of the second interposer, each of the first pads electrically coupled to one of the electrical contacts of a respective top-entry photodetector.

12. The optical module of claim 11, wherein each of the cavities are blind holes formed through the second interposer.

13. The optical module of claim 12, wherein each of the cavities include a thermally conductive underfill layer therein.

14. The optical module of claim 11, wherein the electrical conductors comprise vias extending through the second interposer electrically coupling respective first pads disposed on the first side of the second interposer to respective solder bumps on the second side of the second interposer.

15. The optical module of claim 11, wherein each of the top-entry photodetectors includes a wire bond pad, each of the wire bond pads electrically coupled to respective electrical contacts of the top-entry photodetectors, and wherein each of the wire bond pads are electrically coupled to respective first pads disposed on the first side of the second interposer via respective wire bonds.

16. The optical module of claim 11, further comprising a hermetic sealing ring extending from the second side of the first interposer to the first side of the second interposer configured to solder self-align the first interposer to the second interposer.

17. An optical system comprising:
  an optical transmitter comprising:
    a first interposer having opposing first and second sides;
    a second interposer having opposing first and second sides;
    a plurality of top-emitting vertical-cavity surface-emitting lasers (VCSELs) coupled to the second interposer, the top-emitting VCSELs configured to emit optical signals having different wavelengths through the first interposer, the optical signals configured to be combined and transmitted over a single optical fiber;
    a plurality of electrical conductors forming electrical paths between electrical contacts of the top-emitting VCSELs and the second side of the second interposer; and
    a multiplexer;
  an optical receiver comprising:
    a first interposer having opposing first and second sides;
    a second interposer having opposing first and second sides;
    a plurality of top-entry photodetectors coupled to the second interposer, the top-entry photodetectors configured to receive optical signals having different wavelengths through the first interposer, the optical signals configured to be received from a single optical fiber and demultiplexed such that each of the top-entry photodetectors receives an optical signal with a different respective wavelength;
    a plurality of electrical conductors forming electrical paths between electrical contacts of the top-entry photodetectors and the second side of the second interposer; and
    a demultiplexer; and
  an optical fiber having opposing ends coupled to the optical transmitter and optical receiver respectively, the optical signals configured to be combined via the multiplexer and transmitted to the optical receiver via the optical fiber, the demultiplexer configured to separate the optical signals transmitted via the optical fiber into different wavelengths to be received by respective top-entry photodetectors of the optical receiver,
  wherein the second interposer of the optical transmitter includes a plurality of cavities, wherein each of the top-emitting VCSELs is disposed in a respective cavity, and wherein each of the electrical conductors extends through the second interposer to electrically couple respective first pads disposed on the first side of the second interposer to a respective solder bump on the second side of the second interposer, each of the first pads electrically coupled to one of the electrical contacts of a respective top-emitting VCSEL.

* * * * *